United States Patent [19]
Dreiske et al.

[11] Patent Number: 6,103,544
[45] Date of Patent: Aug. 15, 2000

[54] MULTIPLE COLOR INFRARED DETECTOR

[75] Inventors: Peter D. Dreiske, Plano; Sebastian R. Borrello, Dallas, both of Tex.

[73] Assignee: Raytheon TI Systems, Inc., Lewisville, Tex.

[21] Appl. No.: 09/131,893

[22] Filed: Aug. 10, 1998

Related U.S. Application Data

[62] Division of application No. 08/831,103, Apr. 1, 1997, Pat. No. 5,818,051.
[60] Provisional application No. 60/014,826, Apr. 4, 1996.

[51] Int. Cl.[7] .................................................. H01L 21/00
[52] U.S. Cl. .............................. 438/48; 438/438; 438/57; 438/95
[58] Field of Search .................................. 438/48, 57, 59, 438/65, 74, 77, 84, 93, 95

[56] References Cited

U.S. PATENT DOCUMENTS

| 4,517,464 | 5/1985 | Heath et al. . | |
|---|---|---|---|
| 4,651,001 | 3/1987 | Harada et al. . | |
| 5,120,664 | 6/1992 | Murotani | 438/93 |
| 5,182,217 | 1/1993 | Norton | 438/93 |
| 5,182,624 | 1/1993 | Tran et al. . | |
| 5,189,297 | 2/1993 | Ahlgren . | |
| 5,254,850 | 10/1993 | Dreiske . | |
| 5,279,974 | 1/1994 | Walsh | 438/94 |
| 5,300,777 | 4/1994 | Goodwin . | |
| 5,308,980 | 5/1994 | Barton . | |
| 5,374,841 | 12/1994 | Goodwin . | |
| 5,380,669 | 1/1995 | Norton | 438/74 |
| 5,602,385 | 2/1997 | Mathieu et al. . | |
| 5,789,263 | 8/1998 | Kuo et al. | 438/97 |

FOREIGN PATENT DOCUMENTS 57-142527  9/1982  Japan .

Primary Examiner—Savitri Mulpuri
Attorney, Agent, or Firm—Jacobson, Price, Holman & Stern, PLLC

[57] ABSTRACT

A multiple color infrared detector is provided which is formed from a photodiode (13), a photoconductor (24), and an insulating layer of material (20) disposed between the photodiode (13) and the photoconductor (24). The photodiode (13) detects infrared radiation in the spectral band between about 3 $\mu$m and about 5 $\mu$m, and the photoconductor (24) detects infrared radiation in the spectral band between about 8 $\mu$m and about 13 $\mu$m 15 Claims, 2 Drawing Sheets

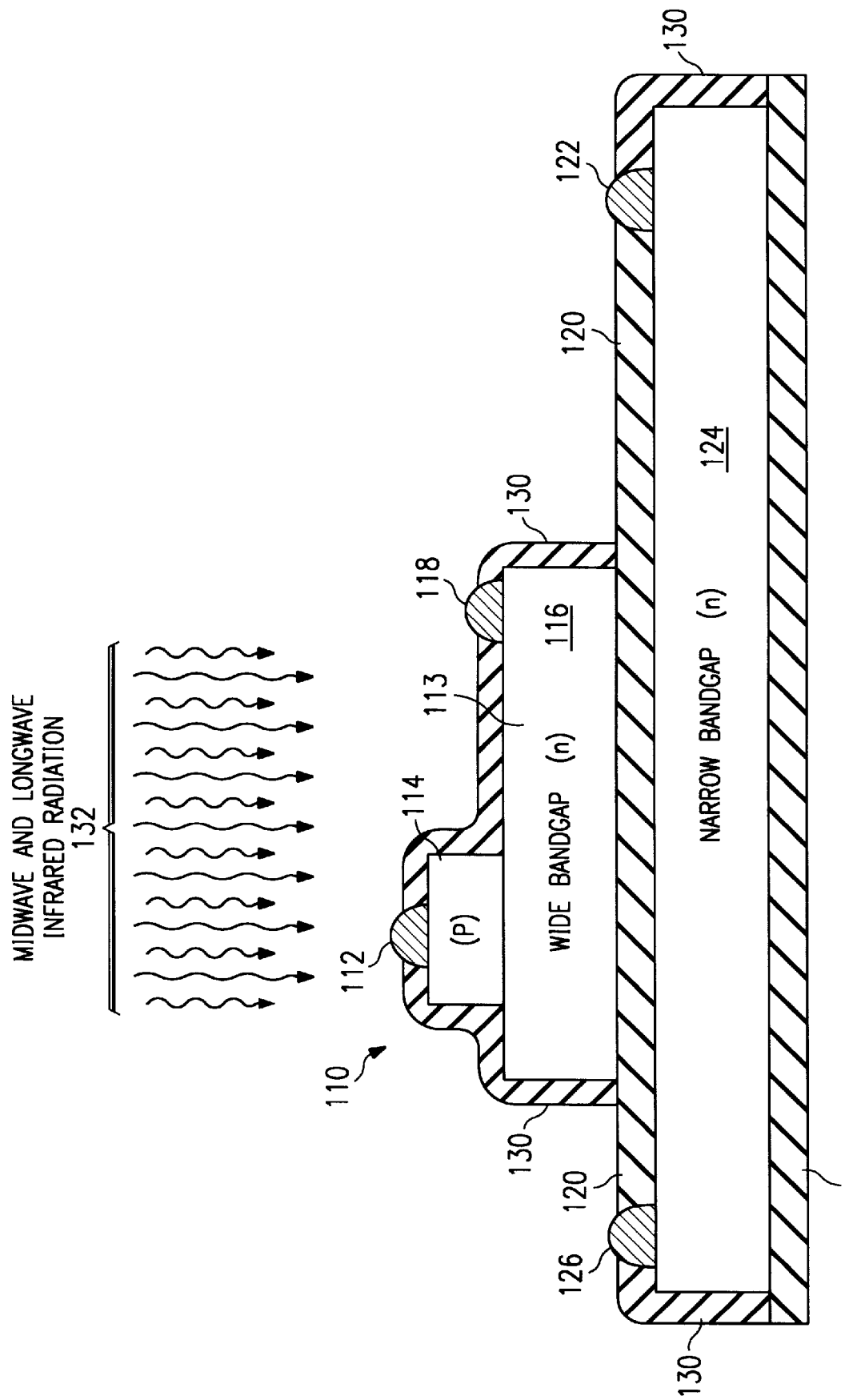

MULTIPLE COLOR INFRARED DETECTOR

This application is a division of U.S. application Ser. No. 08/831,103 filed Apr. 1, 1997, now U.S. Pat. No. 5,818,051 which claims the benefit of U.S. Provisional Application No. 60/014,826 filed Apr. 4, 1996.

TECHNICAL FIELD OF THE INVENTION

The present invention relates in general to infrared detectors, and more particularly, to a semiconductor infrared detector that detects infrared energy in multiple spectral bands.

BACKGROUND OF THE INVENTION

Semiconductor infrared detectors sense electromagnetic radiation, typically, in one of two spectral bands (wavelengths between 3 to 5 $\mu$m and 8 to 13 $\mu$m). Semiconductor infrared detectors have been incorporated into integrated circuits and used for a wide variety of purposes, including the acquisition and tracking of targets, and the detection and measurement of gases.

Two color infrared detectors have been fabricated, which allow simultaneous detection of infrared radiation at two distinct wavelengths. The simultaneous detection of two wavelengths of infrared radiation allows a user to more accurately calculate target locations or measure gas concentrations. In that regard, two color infrared detectors have been very useful in military, environmental monitoring, medical diagnostics, and industrial control process applications. An exemplary two color infrared detector is described in commonly-assigned U.S. Pat. No. 5,300,777 to Goodwin, which is incorporated herein by reference.

However, notwithstanding the advantages of two color infrared detectors over one color detectors, the two color infrared detectors are relatively difficult and expensive to manufacture.

For example, one type of a two color infrared detector is a triple-layer-heterojunction diode. This device consists of two infrared sensitive N-type semiconductor layers separated by a P-type semiconductor layer (i.e., two back-to-back diodes). The P-type layer is insensitive to infrared radiation. Each N-type layer is tuned to a separate infrared wavelength. Unfortunately, this structure requires the additional P-type layer and its related interconnections, and two separate sensing circuits to sense the two wavelengths. Furthermore, the existing photodiodes have problems collecting infrared radiation at the higher cutoff wavelengths without the use of additional cryogenic cooling, which increases the detectors' costs and overall system complexity.

A second device type of a two color infrared detector uses a heterojunction diode in combination with a metal insulator semiconductor (MIS) device. This type of two color infrared detector is described in the Goodwin Patent cited above. However, MIS devices (e.g., MIS capacitors) generate relatively high levels of dark currents (currents generated by defects in the crystal lattice) and also require extensive cooling.

Two color semiconductor infrared devices are typically manufactured in an N×M array having twice the usual number of individual detector elements. Half of the elements are tuned to one infrared wavelength, and the other half are tuned to the second infrared wavelength. In the two types of devices described above, the complexity of the circuit element arrays significantly increases the fabrication cost for the devices, and contributes to the generation of dark currents.

Accordingly, a need has arisen for a semiconductor infrared detector that can detect two bandwidths of infrared radiation simultaneously, operate at higher temperatures without extensive cooling, provide a relatively high immunity to the generation of dark currents, and minimize the cost and complexity of the integrated circuit.

SUMMARY OF THE INVENTION

In accordance with the teachings of the present invention, the disadvantages and problems associated with previously developed infrared detectors have been substantially reduced or eliminated.

According to a preferred embodiment of the present invention, a two color infrared detector is provided that includes a photodiode layer of material and a photoconductor layer of material. The photodiode detects infrared radiation at one wavelength, and the photoconductor detects infrared radiation at a second wavelength. Preferably, the photodiode is arranged on top of the photoconductor.

An important technical advantage of the present invention is that a multiple color infrared detector is formed that can operate at a relatively high temperature without extensive cooling.

Another important technical advantage of the present invention is that a multiple color infrared detector is formed which can minimize the generation of dark currents.

Yet another important technical advantage of the present invention is that a multiple color infrared detector is formed which can minimize the cost and complexity of the integrated circuit.

Still another important technical advantage of the present invention is that a multiple color infrared detector is formed which can collect infrared radiation at relatively high cutoff wavelengths.

BRIEF DESCRIPTION OF THE DRAWINGS

For a more complete understanding of the present invention and the advantages thereof, reference is now made to the following description taken in conjunction with the accompanying drawings, wherein:

FIG. 2 illustrates a cross-sectional view of a multiple color infrared detector, according to a second embodiment of the present invention.

DETAILED DESCRIPTION OF THE INVENTION

Figure 1:
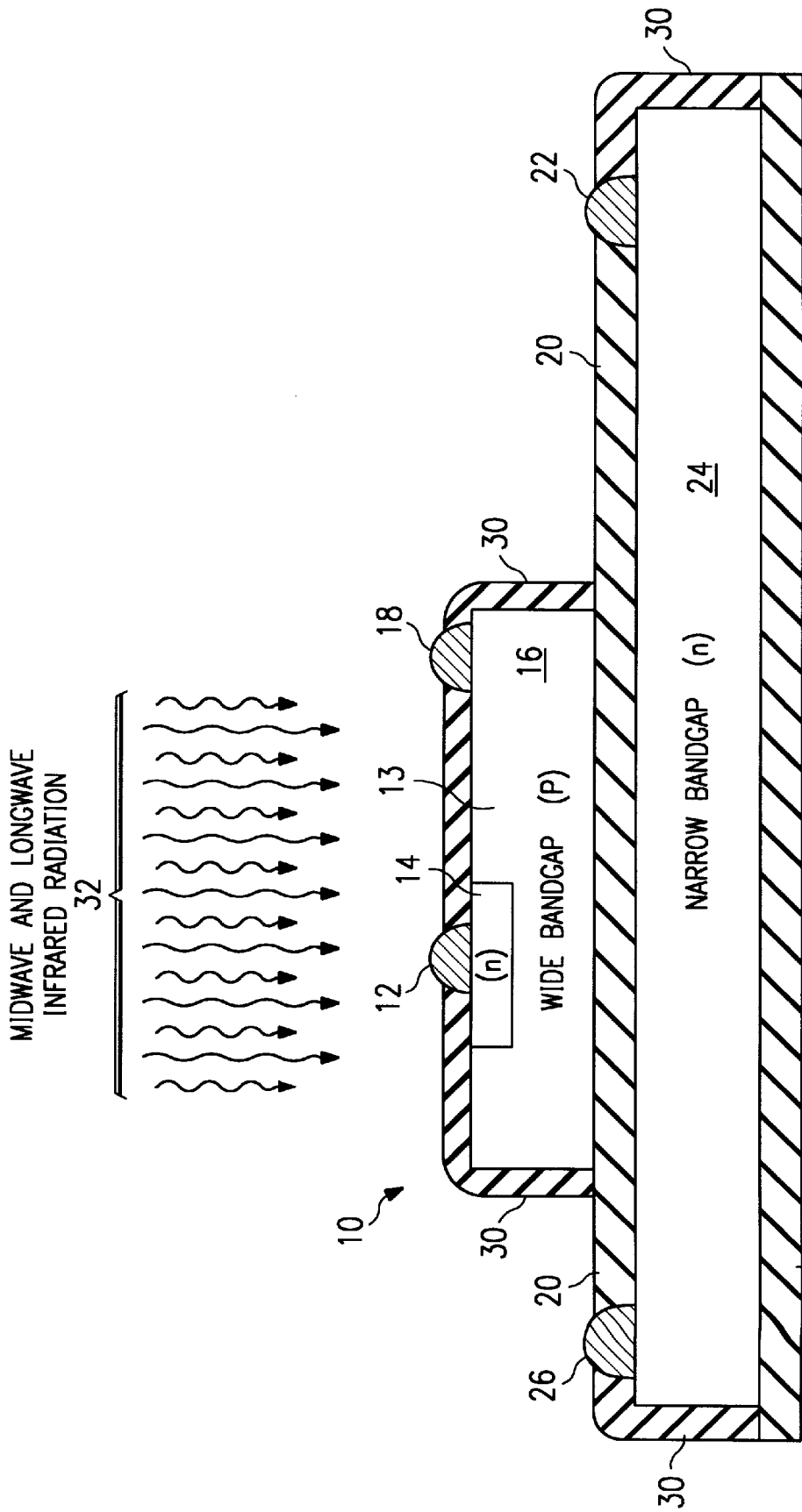
FIG. 1 illustrates a cross-sectional view of a multiple color infrared detector, according to a preferred embodiment of the present invention.

FIG. 1 illustrates a cross-sectional view of a multiple color infrared detector, according to a preferred embodiment of the present invention. Referring to FIG. 1, a two color infrared detector 10 is preferably a heterostructural device composed of a photodiode 13 having an N-type region 14 and a P-type region 16. Photodiode 13 is arranged on top of photoconductor 24. In the illustrative embodiment shown in FIG. 1, photodiode 13 can collect infrared radiation in the spectral band from about 3 $\mu$m to about 5 $\mu$m (e.g., midwave detector). Photoconductor 24 can collect infrared radiation in the spectral band from about 8 $\mu$m to about 13 $\mu$m (e.g., extended longwave detector). By using photodiode 13 in combination with photoconductor 24, detector 10 can detect two wavelengths of infrared radiation simultaneously and also at the higher cutoff wavelengths, without the need for extensive cryogenic cooling. Also, the combination of photodiode 13 and photoconductor 24 can be fabricated with less complexity and at a lower cost than previously developed detectors.

N-type region 14, P-type region 16, and photo conductor 24 may be fabricated from any group II–VI semiconductor material. Nevertheless, although it should be understood that many possible group II–VI semiconducting materials could be used with similar results, mercury cadmium telluride (HgCdTe) is preferably used to fabricate photodiode 13 and photoconductor 24.

The HgCdTe semiconductor material preferably used herein is an alloy of mercury telluride (HgTe) (a conductor having an energy bandgap of about 0 eV) and cadmium telluride (CdTe) (an insulator having an energy bandgap of about 1.6 eV). By adjusting the percentage concentrations of HgTe and CdTe in the alloy, it is possible to vary or "tune" to the spectral band of infrared radiation that will be absorbed by the semiconductor material.

For example, the chemical formula $Hg_{1-x}Cd_xTe$ can be used to describe the preferred alloy of HgTe and CdTe. To create a semiconducting material that generates electron-hole pairs when struck by infrared radiation having a wavelength between 3 $\mu$m to 5 $\mu$m, the value of x should range from about 0.3 to 0.4. To create a semiconducting material that will generate electron-hole pairs when struck by infrared radiation having a wavelength between 8 $\mu$m and 13 $\mu$m, the value of x should range from about 0.2 to 0.25.

In fabricating the HgCdTe semiconductor layers used preferably for photodiode 13 and photoconductor 24 shown in FIG. 1, a P-type material may be produced, for example, by annealing a prepared wafer at high temperatures. This annealing process, which is commonly referred to as intrinsic doping, causes mercury vacancies to form in the lattice. In addition, extrinsic doping with indium at carrier concentrations of about $1\times10^{15}$ to $5\times10^{14}$ atoms/cm$^3$ may be added by a diffusion process. The presence of the mercury vacancies masks any effect from the indium doping, but if the mercury vacancies are later filled, such as by ion implantation, the indium doping may then become dominant.

The N-type region 14 can be created in the P-type region 16 by ion implantation with a suitable material, such as boron. Ion implantation causes mercury molecules to reenter the crystal lattice and fill the mercury vacancies. The boron is not activated and does not enter the crystal lattice unless the semiconductor material is further annealed. When the mercury vacancies are filled as a result of ion implantation, the indium doping then dominates and causes the HgCdTe semiconductor to form as an N-type material. Charge carriers in the N-type HgCdTe semiconductor material thus created have significantly greater mobility than in the P-type HgCdTe semiconductor material, because the mercury vacancies in the P-type material cause greater impurity scattering.

P-type region 16 may be a P-type semiconductor, such as HgCdTe, with a doping concentration of Hg lattice vacancies of approximately $1\times10^{17}$ atoms/cm$^3$. N-type region 14 may be formed by initially doping the HgCdTe with a suitable material, such as indium, at a concentration of about $1\times10^{15}$ to $5\times10^{14}$ atoms/cm$^3$, and by subsequent ion implantation with boron. P-type region 16 is formed on insulating layer 20, and may be grown by any appropriate method, including but not limited to a molecular beam epitaxy (MBE), liquid-phase epitaxy (LPE) or vapor-phase epitaxy (VPE) process. The thickness of P-type region 16 is determined by taking the inverse of the infrared absorption coefficient ($\alpha$) of the semiconductor material. For a HgCdTe semiconductor material used in an infrared detector, the inverse of $\alpha$ is a value typically about 5 $\mu$m to 10 $\mu$m. Again, however, it should be understood that although the use of a HgCdTe semiconductor material fabricated with certain doping concentrations and thicknesses has been described above with respect to a preferred embodiment, the inventive concept is not intended to be so limited. For example, any appropriate configuration and doping concentration for P-type region 16 and N-type region 14 can be used to form a photodiode layer, as long as they meet the functional requirements of photodiode 13.

In the embodiment illustrated in FIG. 1, N-type region 14 and P-type region 16 create a depletion region (not explicitly shown) when photodiode 13 is reverse biased. When the semiconductor material that forms N-type region 14 and P-type region 16 (e.g. HgCdTe) is struck by infrared radiation having a wavelength between about 3 $\mu$m to 5 $\mu$m, electron-hole pairs are generated which diffuse to the depletion region, where they are accelerated by the electric field. In the chemical formula $Hg_{1-x}Cd_xTe$ given above, the value of x therefore ranges from about 0.3 to 0.4 to select a detection bandwidth between about 3 $\mu$m to 5 $\mu$m. P-type region 16 may be doped with a suitable dopant, such as Hg vacancies, of approximately $1\times10^{17}$ atoms/cm$^3$, and may be further doped with indium at a concentration of approximately $1\times10^{15}$ to $5\times10^{14}$ atoms/cm$^3$, so that an N-type HgCdTe semiconductor material may be formed by ion implantation with a suitable material, such as boron.

Insulating layer 20 is disposed between photodiode layer 13 and photoconductor layer 24. P-type region 16 is formed on insulating layer 20. In the preferred embodiment illustrated in FIG. 1, insulating layer 20 is preferably formed on photoconductor layer 24 from a CdTe material grown by a suitable method, such as an MBE, LPE, or VPE process. Insulating layer 20 prevents or minimizes crosstalk between the photodiode and the photoconductor. Crosstalk may also be eliminated by biasing photoconductor 24 appropriately via contacts 22 and 26 with a first power source (not explicitly shown), and biasing photodiode 13 appropriately via contacts 12 and 18 with a second power source. However, the biasing method is the less preferable method of minimizing crosstalk.

Insulating layer 20 may also be formed from an insulating epoxy material, such as, for example, Able Bond 342-1 epoxy, or any similar epoxy material that does not outgas during the curing process, provided the two semiconductor layers being epoxied have been previously passivated. In any event, when insulating layer 20 is formed, the thickness at any point on the upper or lower surface of layer 20 should not vary from the layer's average thickness by greater than 20 percent, in order to maintain the arrangement of P-type region 16 and underlying layer 24 substantially in parallel.

Photoconductor 24 may be grown on insulating substrate 28 by any appropriate method, including but not limited to an MBE, LPE, or VPE process. Photoconductor 24 generates electron-hole pairs when struck by infrared radiation having a wavelength between about 8 $\mu$m and 13 $\mu$m, and may be any suitable semiconducting material, such as HgCdTe. In the chemical formula $Hg_{1-x}Cd_xTe$, the value of x ranges from about 0.2 to 0.25 for such a detection bandwidth between about 8 $\mu$m to 13 $\mu$m. The thickness of photoconductor 24 is determined by taking the inverse of the infrared absorption coefficient ($\alpha$) of the semiconductor material. For HgCdTe semiconductors used in infrared detectors, the inverse of $\alpha$ is about 5 $\mu$m to 10 $\mu$m. Photoconductor 24 may be doped with a suitable dopant, such as indium.

Metallic contacts 12 and 18 are formed to provide an electrical connection to photodiode 13, and metallic contacts 22 and 26 are formed to provide an electrical connection to photoconductor 24. Preferably, because of its size relative to N-type region 14, metallic contact 12 is formed from a conducting material that is virtually transparent to infrared radiation, such as titanium oxy-nitride (TiON). Contacts 18, 22 and 26 may also be formed from a material such as TiON, but also may be formed from any other suitable contact material.

Passivating layer 30 is formed on all exposed portions of the crystal lattice of N-type region 14, P-type region 16, and photoconductor 24. Passivating layer 30 may be CdTe, zinc sulfide (ZnS), or any other appropriate passivation material. In addition, an opaque coating (not explicitly shown) may be used to define a photon collection aperture in detector 10.

In operation, for the preferred embodiment shown in FIG. 1, photodiode 13 formed by N-type region 14 and P-type region 16 is preferably reverse-biased by applying a voltage (e.g. 0.5V) at contact 12 and a lower voltage (e.g. 0V) at contact 18. A depletion region (not explicitly shown) is formed at the interface between N-type region 14 and P-type region 16, which extends into each region 14 and 16. Midwave infrared radiation 32 strikes photodiode 13, and is absorbed by N-type region 14 and P-type region 16. This absorbed infrared radiation generates electron-hole pairs. The electrons and holes diffuse throughout the crystal lattice to the depletion region (not explicitly shown), where they are accelerated by the electric field toward contacts 12 and 18. These electrons and holes thus create a current that is directly proportional to the infrared radiation absorbed by the device and essentially independent of the applied bias voltage.

Photoconductor 24 functions as a variable resistor. A bias current from a constant current source (not explicitly shown) is applied through contacts 22 and 26. Long-wave infrared radiation (32) strikes detector 10 as shown in FIG. 1, but passes through N-type region 14, P-type region 16, and insulator layer 20 with only a relatively small amount of absorption. Preferably, the thicknesses of N-type region 14, P-type region 16, and insulator layer 20 are chosen to allow sufficient infrared radiation to reach photoconductor 24. When the long-wave infrared radiation is absorbed by photoconductor 24, electron-hole pairs are generated in the N-type material. The electrons are accelerated toward the more positive of contacts 22 or 26 by the electric field created across the photoconductor by the bias current. The holes are accelerated toward the more negative of contacts 22 or 26 by the electric field. These electrons and holes thus create a current that is directly proportional to the infrared radiation absorbed by the device.

Detector 10 shown in FIG. 1 may be fabricated by the following method. First, N-type region 24 and P-type region 16 are passivated on one planar side with passivating layer 30. Passivating layer 30 may be CdTe or any other appropriate material. N-type region 24 is then thinned to approximately 10 $\mu$m, and the second planar side of N-type region 24 is passivated. P-type region 16 then thinned to approximately 10 $\mu$m, and the passivated planar surface of P-type region 16 is then attached to each opposing surface of N-type region (photoconductor layer) 24 with Able Bond 342-1 epoxy or any similar epoxy material that does not outgas during curing.

A plurality of individual detectors 10 are then delineated from the bonded combination of P-type region 16 and N-type region 24. On each detector 10, contact 18 is formed on non-passivated surface of P-type region 16. Contacts 22 and 26 are formed on N-type region 24 of detector 10 after passivating layer 30 is removed at the two locations. N-type region 14 is formed by ion-implantation of P-type region 16, and contact 12 is formed using a transparent metal material, such as TiON. The top of P-type region 16 and the sidewalls of N-type region 24 and P-type region 16 are then passivated. Detector 10 may then be covered with an anti-reflective coating, such as ZnS. Detector 10 may also be covered with an opaque layer of material in a particular arrangement that forms an optical aperture to more readily admit infrared radiation.

FIG. 2 illustrates a cross-sectional view of a multiple color infrared detector, according to a second embodiment of the present invention. The construction of the multiple color detector shown in FIG. 2 is essentially the same as that of detector 10 shown in FIGURE, except with a few distinctions.

Referring to FIG. 2, a two color infrared detector 110 is preferably a heterostructural device composed of a photodiode 113 having a P-type region 114 and an N-type region 116. Photodiode 113 is arranged on top of a photoconductor 124. In the illustrative embodiment shown in FIG. 2, photodiode 113 can collect infrared radiation in the spectral band from about 3 $\mu$m to about 5 $\mu$m (e.g., midwave detector). Photoconductor 124 can collect infrared radiation in the spectral band from about 8 $\mu$m to about 13 $\mu$m (e.g., extended longwave detector).

P-type region 114 may be a P-type semiconductor material, such as HgCdTe, with a doping concentration of approximately $1\times10^{17}$ atoms/cm$^3$. P-type region 114 may be formed by any appropriate method, such as by a MBE, LPE, or VPE process. N-type region 116 may be HgCdTe with an appropriate doping concentration, such as indium at a concentration of about $1\times10^{15}$ to $5\times10^{14}$ atoms/cm$^3$. N-type region 116 is arranged on insulating layer 120, and may be grown by any appropriate method, such as a MBE, LPE, or VPE process. However, the invention is not intended to be limited to any particular material, configuration, or dopant concentration. For example, other configurations and dopant concentration of P-type region 114 and N-type region 116 can be used to form photodiode 113, as long as the resulting photodiode has the functional capabilities as that of photodiode 113.

In the embodiment illustrated in FIG. 2, N-type region 116 and P-type region 114 create a depletion region (not explicitly shown) when photodiode 113 is reverse-biased. When the semiconductor material that forms N-type region 116 and P-type region 114 (e.g. HgCdTe) is struck by infrared radiation having a wavelength between about 3 $\mu$m to about 5 $\mu$m, electron-hole pairs are generated which diffuse to the depletion region, where they are accelerated by the electric field. In the above-described chemical formula $Hg_{1-x}Cd_xTe$, for HgCdTe material, the value of x ranges from about 0.3 to about 0.4 for a detection range between about 3 $\mu$m to about 5 $\mu$m. P-type region 114 may be doped with a suitable dopant, such as Hg vacancies, at a concentration of approximately $1\times10^{17}$ atoms/cm$^3$, and may be further doped with indium, for example, at a concentration of approximately $1\times10^{15}$ to $5\times10^{14}$ atoms/cm$^3$.

Insulating layer 120 is disposed between photodiode 113 and photoconductor 124. N-type region 116 is formed on insulating layer 120. Insulating layer 120 may be composed of any insulating material grown by any appropriate method, including but not limited to a MBE, LPE, or VPE process, but is preferably CdTe. As an alternative, insulating layer 120 may be an epoxy material, such as, for example, Able Bond 342-1 epoxy, or any similar epoxy material that does not outgas during curing. Insulating layer 120 prevents or minimizes crosstalk between photodiode 113 and photoconductor 124.

Photoconductor 124 may be grown on insulating substrate 128 by any appropriate method, including but not limited to, an MBE, LPE, or VPE process. Photoconductor 124 generates electron-hole pairs when struck by infrared radiation having a wavelength between about 8 $\mu$m and about 13 $\mu$m, and may be any suitable semiconducting material, such as HgCdTe. For HgCdTe material, in the chemical formula $Hg_{1-x}Cd_xTe$, the value of x ranges from approximately 0.2 to 0.25 for a detection range between about 8 $\mu$m to about 13 $\mu$m. The thickness of photoconductor 124 is determined by taking the inverse of the infrared absorption coefficient ($\alpha$) of the semiconductor material. Photoconductor 124 may be doped with a suitable dopant such as indium.

Metallic contacts 112 and 118 provide an electrical connection to photodiode 113, and metallic contacts 122 and 126 provide an electrical connection to photoconductor 124. Contact 112 may be formed from TiON. Passivating layer 130 is formed on the exposed portions of the crystal lattice of N-type region 116, P-type region 114, and photoconductor 124. Passivating layer 130 may be formed from CdTe, ZnS, or any other appropriate material. In addition, an opaque coating (not explicitly shown) may be used to define a photon collection aperture in detector 110.

In operation, for the embodiment illustrated in FIG. 2, photodiode 113, which is formed by N-type region 116 and P-type region 114, is reverse-biased by applying a voltage on contact 118 (e.g. 0.5V) and a lower voltage on contact 112 (e.g. 0V). A depletion region (not explicitly shown) is formed at the interface between N-type region 114 and P-type region 116, which extends into each region 114 and 116. Midwave infrared radiation 132 strikes photodiode 113 as shown in FIG. 2, and is absorbed by P-type region 114 and N-type region 116. The absorbed infrared radiation generates electron-hole pairs. The electrons and holes diffuse throughout the crystal lattice to the depletion region (not explicitly shown), where they are accelerated by the electric field toward contacts 112 and 118. These electrons and holes thus create a current that is directly proportional to the infrared radiation absorbed by the device and essentially independent of the applied bias voltage.

Photoconductor 124 functions as a variable resistor. A bias current from a constant current source (not explicitly shown) is applied to contacts 122 and 126. Long-wave infrared radiation strikes the device as shown in FIG. 2, but passes through P-type region 114, N-type region 116, and insulator layer 120 with only a small amount of absorption. Preferably, the thicknesses of P-type region 114, N-type region 116, and insulator layer 120 are chosen to allow sufficient infrared radiation to reach photoconductor 124. When the long-wave infrared radiation is absorbed by photoconductor 124, electron-hole pairs are generated in the N-type material. The electrons are accelerated toward the more positive of contacts 122 or 126 by the electric field created across the photoconductor material by the bias current. The holes are accelerated toward the more negative of contacts 122 or 126 by the electric field. These electrons and holes thus create a current that is directly proportional to the infrared radiation absorbed by detector 110.

Although the present invention has been described in detail, it should be understood that various changes, substitutions, and alterations can be made hereto without departing from the spirit and scope of the invention as defined by the appended claims.

What is claimed is:

1. A method of fabricating a multiple color infrared detector, comprising the steps of:

backside passivating a layer of N-type semiconductor material;

backside passivating a layer of P-type semiconductor material;

thinning said N-type semiconductor layer to a thickness of about 10 $\mu$m;

topside passivating said layer of N-type semiconductor material;

affixing said layer of P-type semiconductor material to said layer of N-type semiconductor material;

thinning said P-type semiconductor layer to a thickness of about 10 $\mu$m;

forming a first and second electrical contact on said layer of N-type semiconductor material;

forming a third electrical contact on said layer of P-type semiconductor material;

topside passivating said layer of P-type semiconductor material;

passivating a plurality of sidewalls of said layers of N-type and P-type semiconductor material;

forming an N-type region in said layer of P-type semiconductor material; and forming a fourth electrical contact in said N-type region.

2. The method of claim 1, wherein the affixing step comprises the step of epoxying said layer of N-type semiconductor material to said layer of P-type semiconductor material.

3. The method of claim 1, wherein the affixing step comprises the step of disposing a layer of insulating material between said layers of N-type and P-type material.

4. The method of claim 1, wherein the step of forming an N-type region comprises forming an N-type region by an ion implantation process.

5. The method of claim 1, wherein said layers of N-type and P-type material each comprise a HgCdTe material.

6. A method of fabricating a multiple color infrared detector, comprising the steps of:

providing a first photosensitive component which is operative to detect infrared radiation in a first waveband;

providing a second photosensitive component which is operative to detect infrared radiation in a second waveband; different from the first waveband;

adhesively securing the first photosensitive component to the second photosensitive component with an adhesive insulating layer in a manner so that the second photosensitive component is spaced from the first photosensitive component in a direction of propagation of infrared radiation through the detector, the adhesive insulating layer being disposed between the first photosensitive component and the second photosensitive component, and being transparent to infrared radiation in the second waveband, the second photosensitive component being operative to detect radiation in the second waveband which has passed through the rst photosensitive component and the insulating layer;

wherein said first photosensitive component comprises a photodiode or a photoconductor;

wherein said second photosensitive component comprises a photodiode or a photoconductor; and wherein when said first photosensitive component comprises a photodiode said second photosensitive component comprises a photoconductor, and when said first photosensitive component comprises a photoconductor said second photosensitive component comprises a photodiode.

7. A method according claim 6, wherein said step of providing the first photosensitive component includes the step of fabricating a photodiode, and wherein said step of providing the second photosensitive component includes the step of fabricating a photoconductor.

8. A method according to claim 7, wherein said step of fabricating the photodiode includes the step of fabricating a HgCdTe N-type layer of material adjacent a HgCdTe P-type layer of material.

9. A method according to claim 7, wherein said step of fabricating the photoconductor includes the step of fabricating a HgCdTe N-type layer of material.

10. A method according to claim 7, wherein said step of fabricating the photodiode includes the step of fabricating the photodiode to detect radiated energy having a wavelength in a range between about 3 $\mu$m to about 5 $\mu$m, and wherein said step of fabricating the photoconductor includes the step of fabricating the photoconductor to detect radiated energy having a wavelength in a range between about 8 $\mu$m to about 13 $\mu$m.

11. A method according to claim 6, wherein said adhesively securing step includes the step of using an epoxy as the adhesive insulating layer.

12. A method according to claim 8 further comprising a step of passivating one planar side of said N-type layer with a passivating layer comprising CdTe.

13. A method according to claim 8 comprising a step of covering a surface of the infrared detector with a antireflective layer.

14. A method according to claim 6 wherein said insulating material comprises CdTe.

15. A method according to claim 8 wherein said step of fabricating a HgCdTe N-type layer comprises doping with indium followed by ion implantation with boron.

* * * * *